(12) United States Patent
Russell-Clarke et al.

(10) Patent No.: US 9,125,298 B2
(45) Date of Patent: Sep. 1, 2015

(54) FUSED GLASS DEVICE HOUSINGS

(71) Applicant: Apple Inc., Cupertino, CA (US)

(72) Inventors: Peter N. Russell-Clarke, San francisco, CA (US); Michael K. Pilliod, San Francisco, CA (US); Jonathan P. Ive, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/295,110

(22) Filed: Jun. 3, 2014

(65) Prior Publication Data

US 2014/0285956 A1    Sep. 25, 2014

Related U.S. Application Data

(63) Continuation of application No. 13/358,389, filed on Jan. 25, 2012, now Pat. No. 8,773,848.

(51) Int. Cl.
*G06F 1/16* (2006.01)
*H05K 5/02* (2006.01)
*C03B 23/24* (2006.01)
(Continued)

(52) U.S. Cl.
CPC .............. *H05K 5/02* (2013.01); *C03B 23/245* (2013.01); *H04M 1/0266* (2013.01); *H05K 5/0017* (2013.01); *H04M 1/0268* (2013.01)

(58) Field of Classification Search
USPC .................. 345/173, 174, 175, 156, 168, 634;
348/374, 739, 129, 46, 135, 837, 455;
349/158, 110, 54, 192; 361/679.21,
361/679.22, 679.23, 679.24, 679.25,
361/679.26, 679.27, 679.01, 679.02,
361/679.34, 679.56, 679.29; 428/131, 137,
428/134, 410, 34
See application file for complete search history.

(56) References Cited

U.S. PATENT DOCUMENTS 3,415,637 A    12/1968  Glynn
3,467,508 A     9/1969  Loukes et al.
(Continued)

FOREIGN PATENT DOCUMENTS

AT    283 630 B    10/1970
CN    1277090 A    12/2000
(Continued)

OTHER PUBLICATIONS

Chemically Strengthened Glass, Wikipedia, Apr. 19, 2009, http://en/wikipedia.org/w/index.php?title=Chemically_strengthened_glass&oldid=284794988.
(Continued)

*Primary Examiner* — Hung Duong

(57) ABSTRACT

An electronic device may have a glass housing structures. The glass housing structures may be used to cover a display and other internal electronic device components. The glass housing structure may have multiple glass pieces that are joined using a glass fusing process. A peripheral glass member may be fused along the edge of a planar glass member to enhance the thickness of the edge. A rounded edge feature may be formed by machining the thickened edge. Raised fused glass features may surround openings in the planar glass member. Multiple planar glass members may be fused together to form a five-sided box in which electronic components may be mounted. Raised support structure ribs may be formed by fusing glass structures to a planar glass member. Opaque masking material and colored glass may be used to create portions of the glass housing structures that hide internal device components from view.

20 Claims, 20 Drawing Sheets

(51) Int. Cl.
*H04M 1/02* (2006.01)
*H05K 5/00* (2006.01)

(56) References Cited

U.S. PATENT DOCUMENTS

| | | | |
|---|---|---|---|
| 3,498,773 A | 3/1970 | Due et al. |
| 3,558,415 A | 1/1971 | Rieser et al. |
| 3,607,172 A | 9/1971 | Poole et al. |
| 3,619,240 A | 11/1971 | Toussaint et al. |
| 3,626,723 A | 12/1971 | Plumat |
| 3,652,244 A | 3/1972 | Plumat |
| 3,753,840 A | 8/1973 | Plumat |
| 3,798,013 A | 3/1974 | Hasegawa et al. |
| 3,843,472 A | 10/1974 | Toussaint et al. |
| 3,857,689 A | 12/1974 | Koizumi et al. |
| 4,015,045 A | 3/1977 | Rinehart |
| 4,119,760 A | 10/1978 | Rinehart |
| 4,156,755 A | 5/1979 | Rinehart |
| 4,165,228 A | 8/1979 | Ebata et al. |
| 4,178,082 A | 12/1979 | Ganswein et al. |
| 4,212,919 A | 7/1980 | Hoda |
| 4,346,601 A | 8/1982 | France |
| 4,353,649 A | 10/1982 | Kishii |
| 4,425,810 A | 1/1984 | Simon et al. |
| 4,646,722 A | 3/1987 | Silverstein et al. |
| 4,733,973 A | 3/1988 | Machak et al. |
| 4,842,629 A | 6/1989 | Clemens et al. |
| 4,844,724 A | 7/1989 | Sakai et al. |
| 4,846,868 A | 7/1989 | Aratani |
| 4,849,002 A | 7/1989 | Rapp |
| 4,872,896 A | 10/1989 | LaCourse et al. |
| 4,911,743 A | 3/1990 | Bagby |
| 4,937,129 A | 6/1990 | Yamazaki |
| 4,957,364 A | 9/1990 | Chesler |
| 4,959,548 A | 9/1990 | Kupperman et al. |
| 4,983,197 A | 1/1991 | Froning et al. |
| 4,986,130 A | 1/1991 | Engelhaupt et al. |
| 5,041,173 A | 8/1991 | Shikata et al. |
| 5,104,435 A | 4/1992 | Oikawa et al. |
| 5,129,934 A | 7/1992 | Koss |
| 5,157,746 A | 10/1992 | Tobita et al. |
| 5,160,523 A | 11/1992 | Honkanen et al. |
| 5,254,149 A | 10/1993 | Hashemi et al. |
| 5,269,888 A | 12/1993 | Morasca |
| 5,281,303 A | 1/1994 | Beguin et al. |
| 5,369,267 A | 11/1994 | Johnson et al. |
| 5,411,563 A | 5/1995 | Yeh |
| 5,437,193 A | 8/1995 | Schleitweiler et al. |
| 5,445,871 A | 8/1995 | Murase et al. |
| 5,483,261 A | 1/1996 | Yasutake |
| 5,488,204 A | 1/1996 | Mead et al. |
| 5,525,138 A | 6/1996 | Hashemi et al. |
| 5,625,154 A | 4/1997 | Matsuhiro et al. |
| 5,654,057 A | 8/1997 | Kitayama |
| 5,733,622 A | 3/1998 | Starcke et al. |
| 5,766,493 A | 6/1998 | Shin |
| 5,780,371 A | 7/1998 | Rifqi et al. |
| 5,816,225 A | 10/1998 | Koch et al. |
| 5,825,352 A | 10/1998 | Bisset et al. |
| 5,835,079 A | 11/1998 | Shieh |
| 5,880,411 A | 3/1999 | Gillespie et al. |
| 5,930,047 A | 7/1999 | Gunz et al. |
| 5,953,094 A | 9/1999 | Matsuoka et al. |
| 5,985,014 A | 11/1999 | Ueda et al. |
| 6,050,870 A | 4/2000 | Suginoya et al. |
| 6,120,908 A | 9/2000 | Papanu et al. |
| 6,166,915 A | 12/2000 | Lake et al. |
| 6,188,391 B1 | 2/2001 | Seely et al. |
| 6,245,313 B1 | 6/2001 | Suzuki et al. |
| 6,307,590 B1 | 10/2001 | Yoshida |
| 6,310,610 B1 | 10/2001 | Beaton et al. |
| 6,323,846 B1 | 11/2001 | Westerman et al. |
| 6,325,704 B1 | 12/2001 | Brown et al. |
| 6,327,011 B2 | 12/2001 | Kim |
| 6,350,664 B1 | 2/2002 | Haji et al. |
| 6,393,180 B1 | 5/2002 | Farries et al. |
| 6,429,840 B1 | 8/2002 | Sekiguchi |
| 6,437,867 B2 | 8/2002 | Zeylikovich et al. |
| 6,516,634 B1 | 2/2003 | Green et al. |
| 6,521,862 B1 | 2/2003 | Brannon |
| 6,621,542 B1 | 9/2003 | Aruga |
| 6,690,387 B2 | 2/2004 | Zimmerman et al. |
| 6,718,612 B2 | 4/2004 | Bajorek |
| 6,769,274 B2 | 8/2004 | Cho et al. |
| 6,810,688 B1 | 11/2004 | Duisit et al. |
| 6,936,741 B2 | 8/2005 | Munnig et al. |
| 6,955,971 B2 | 10/2005 | Ghyselen et al. |
| 6,996,324 B2 | 2/2006 | Hiraka et al. |
| 7,012,700 B2 | 3/2006 | De Groot et al. |
| 7,013,709 B2 | 3/2006 | Hajduk et al. |
| 7,015,894 B2 | 3/2006 | Morohoshi |
| 7,070,837 B2 | 7/2006 | Ross |
| 7,184,064 B2 | 2/2007 | Zimmerman et al. |
| 7,461,564 B2 | 12/2008 | Glaesemann |
| 7,558,054 B1 | 7/2009 | Prest et al. |
| 7,626,807 B2 | 12/2009 | Hsu |
| 7,663,607 B2 | 2/2010 | Hotelling et al. |
| 7,810,355 B2 | 10/2010 | Feinstein et al. |
| 7,872,644 B2 | 1/2011 | Hong et al. |
| 7,918,019 B2 | 4/2011 | Chang et al. |
| 8,110,268 B2 | 2/2012 | Hegemier et al. |
| 8,111,248 B2 | 2/2012 | Lee et al. |
| 8,312,743 B2 | 11/2012 | Pun et al. |
| 8,393,175 B2 | 3/2013 | Kohli et al. |
| 8,551,283 B2 | 10/2013 | Pakula et al. |
| 8,673,163 B2 | 3/2014 | Zhong |
| 8,684,613 B2 | 4/2014 | Weber et al. |
| 2002/0035853 A1 | 3/2002 | Brown et al. |
| 2002/0155302 A1 | 10/2002 | Smith et al. |
| 2002/0157199 A1 | 10/2002 | Piltingsrud |
| 2003/0024274 A1 | 2/2003 | Cho et al. |
| 2003/0057183 A1 | 3/2003 | Cho et al. |
| 2003/0234771 A1 | 12/2003 | Mulligan et al. |
| 2004/0051944 A1 | 3/2004 | Stark |
| 2004/0119701 A1 | 6/2004 | Mulligan et al. |
| 2004/0142118 A1 | 7/2004 | Takechi |
| 2004/0163414 A1 | 8/2004 | Eto et al. |
| 2005/0058423 A1 | 3/2005 | Brinkmann et al. |
| 2005/0105071 A1 | 5/2005 | Ishii |
| 2005/0135724 A1 | 6/2005 | Helvajian et al. |
| 2005/0193772 A1 | 9/2005 | Davidson et al. |
| 2005/0245165 A1 | 11/2005 | Harada et al. |
| 2005/0285991 A1 | 12/2005 | Yamazaki |
| 2006/0026521 A1 | 2/2006 | Hotelling et al. |
| 2006/0055936 A1 | 3/2006 | Yun et al. |
| 2006/0070694 A1 | 4/2006 | Rehfeld et al. |
| 2006/0097991 A1 | 5/2006 | Hotelling et al. |
| 2006/0197753 A1 | 9/2006 | Hotelling et al. |
| 2006/0227331 A1 | 10/2006 | Wollmer et al. |
| 2006/0238695 A1 | 10/2006 | Miyamoto |
| 2006/0250559 A1 | 11/2006 | Bocko et al. |
| 2006/0268528 A1 | 11/2006 | Zadesky et al. |
| 2006/0292822 A1 | 12/2006 | Xie |
| 2007/0003796 A1 | 1/2007 | Isono et al. |
| 2007/0013822 A1 | 1/2007 | Kawata et al. |
| 2007/0029519 A1 | 2/2007 | Kikuyama et al. |
| 2007/0030436 A1 | 2/2007 | Sasabayashi |
| 2007/0039353 A1 | 2/2007 | Kamiya |
| 2007/0046200 A1 | 3/2007 | Fu et al. |
| 2007/0063876 A1 | 3/2007 | Wong |
| 2007/0089827 A1 | 4/2007 | Funatsu |
| 2007/0122542 A1 | 5/2007 | Halsey et al. |
| 2007/0132737 A1 | 6/2007 | Mulligan et al. |
| 2007/0196578 A1 | 8/2007 | Karp et al. |
| 2007/0236618 A1 | 10/2007 | Magg et al. |
| 2008/0026260 A1 | 1/2008 | Kawai |
| 2008/0074028 A1 | 3/2008 | Ozolins et al. |
| 2008/0094716 A1 | 4/2008 | Ushiro et al. |
| 2008/0135175 A1 | 6/2008 | Higuchi |
| 2008/0158181 A1 | 7/2008 | Hamblin et al. |
| 2008/0202167 A1 | 8/2008 | Cavallaro et al. |
| 2008/0243321 A1 | 10/2008 | Walser et al. |
| 2008/0258603 A1* | 10/2008 | Shinohe et al. ............ 313/487 |
| 2008/0261057 A1 | 10/2008 | Slobodin |

(56) References Cited

U.S. PATENT DOCUMENTS

| | | |
|---|---|---|
| 2008/0264176 A1 | 10/2008 | Bertrand et al. |
| 2008/0286548 A1 | 11/2008 | Ellison et al. |
| 2009/0046240 A1 | 2/2009 | Bolton |
| 2009/0067141 A1 | 3/2009 | Dabov et al. |
| 2009/0091551 A1 | 4/2009 | Hotelling et al. |
| 2009/0096937 A1 | 4/2009 | Bauer et al. |
| 2009/0153729 A1 | 6/2009 | Hiltunen et al. |
| 2009/0162703 A1 | 6/2009 | Kawai |
| 2009/0197048 A1 | 8/2009 | Amin et al. |
| 2009/0202808 A1 | 8/2009 | Glaesemann et al. |
| 2009/0220761 A1 | 9/2009 | Dejneka et al. |
| 2009/0257189 A1 | 10/2009 | Wang et al. |
| 2009/0294420 A1 | 12/2009 | Abramov et al. |
| 2009/0324899 A1 | 12/2009 | Feinstein et al. |
| 2009/0324939 A1 | 12/2009 | Feinstein et al. |
| 2010/0009154 A1 | 1/2010 | Allan et al. |
| 2010/0028607 A1 | 2/2010 | Lee et al. |
| 2010/0053632 A1 | 3/2010 | Alphonse et al. |
| 2010/0062284 A1 | 3/2010 | Watanabe et al. |
| 2010/0119846 A1 | 5/2010 | Sawada |
| 2010/0137031 A1 | 6/2010 | Griffin et al. |
| 2010/0154992 A1 | 6/2010 | Feinstein et al. |
| 2010/0167059 A1 | 7/2010 | Hasimoto et al. |
| 2010/0171920 A1 | 7/2010 | Nishiyama |
| 2010/0179044 A1 | 7/2010 | Sellier et al. |
| 2010/0206008 A1 | 8/2010 | Harvey et al. |
| 2010/0215862 A1 | 8/2010 | Gomez et al. |
| 2010/0216514 A1 | 8/2010 | Smoyer et al. |
| 2010/0224767 A1 | 9/2010 | Kawano et al. |
| 2010/0265188 A1 | 10/2010 | Chang et al. |
| 2010/0279067 A1 | 11/2010 | Sabia et al. |
| 2010/0285275 A1 | 11/2010 | Baca et al. |
| 2010/0296027 A1 | 11/2010 | Matsuhira et al. |
| 2010/0315570 A1 | 12/2010 | Mathew et al. |
| 2010/0321305 A1 | 12/2010 | Chang et al. |
| 2011/0003619 A1 | 1/2011 | Fujii |
| 2011/0012873 A1 | 1/2011 | Prest et al. |
| 2011/0019123 A1 | 1/2011 | Prest et al. |
| 2011/0019354 A1 | 1/2011 | Prest et al. |
| 2011/0030209 A1 | 2/2011 | Chang et al. |
| 2011/0067447 A1 | 3/2011 | Prest et al. |
| 2011/0072856 A1 | 3/2011 | Davidson et al. |
| 2011/0102346 A1 | 5/2011 | Orsley et al. |
| 2011/0159321 A1 | 6/2011 | Eda et al. |
| 2011/0164372 A1 | 7/2011 | McClure et al. |
| 2011/0186345 A1 | 8/2011 | Pakula et al. |
| 2011/0199687 A1 | 8/2011 | Sellier et al. |
| 2011/0248152 A1 | 10/2011 | Svajda et al. |
| 2011/0255000 A1 | 10/2011 | Weber et al. |
| 2011/0255250 A1 | 10/2011 | Dinh |
| 2011/0267833 A1 | 11/2011 | Verrat-Debailleul et al. |
| 2011/0300908 A1 | 12/2011 | Grespan et al. |
| 2012/0018323 A1 | 1/2012 | Johnson et al. |
| 2012/0027399 A1 | 2/2012 | Yeates |
| 2012/0099113 A1 | 4/2012 | de Boer et al. |
| 2012/0105400 A1 | 5/2012 | Mathew et al. |
| 2012/0118628 A1 | 5/2012 | Pakula et al. |
| 2012/0135195 A1 | 5/2012 | Glaesemann et al. |
| 2012/0136259 A1 | 5/2012 | Milner et al. |
| 2012/0151760 A1 | 6/2012 | Steijner |
| 2012/0188743 A1 | 7/2012 | Wilson et al. |
| 2012/0196071 A1 | 8/2012 | Cornejo et al. |
| 2012/0202040 A1 | 8/2012 | Barefoot et al. |
| 2012/0236477 A1 | 9/2012 | Weber et al. |
| 2012/0236526 A1 | 9/2012 | Weber et al. |
| 2012/0281381 A1 | 11/2012 | Sanford |
| 2012/0328843 A1 | 12/2012 | Cleary et al. |
| 2013/0083506 A1 | 4/2013 | Wright et al. |
| 2013/0182259 A1 | 7/2013 | Brezinski et al. |
| 2013/0188366 A1* | 7/2013 | Russell-Clarke et al. .... 362/362 |
| 2014/0176779 A1 | 6/2014 | Weber et al. |

FOREIGN PATENT DOCUMENTS

| | | |
|---|---|---|
| CN | 1369449 A | 9/2002 |
| CN | 1694589 A | 11/2005 |
| CN | 101025502 | 8/2007 |
| CN | 101206314 | 6/2008 |
| CN | 102131357 | 7/2011 |
| CN | 1322339 A | 11/2011 |
| DE | 17 71 268 A1 | 12/1971 |
| DE | 32 12 612 A1 | 10/1983 |
| DE | 103 22 350 A1 | 12/2004 |
| EP | 1592073 | 11/2005 |
| EP | 2025556 A2 | 2/2009 |
| EP | 2036867 A1 | 3/2009 |
| EP | 2075237 | 7/2009 |
| EP | 2196870 A1 | 6/2010 |
| EP | 2483216 | 8/2012 |
| EP | 2635540 | 9/2013 |
| GB | 1 346 747 | 2/1974 |
| JP | B S42-011599 | 6/1963 |
| JP | B-S48-006925 | 3/1973 |
| JP | 55031944 | 3/1980 |
| JP | 55 067529 | 5/1980 |
| JP | 55-95645 | 7/1980 |
| JP | 55 144450 | 11/1980 |
| JP | 59037451 | 2/1984 |
| JP | A S61-097147 | 5/1986 |
| JP | 6066696 | 10/1986 |
| JP | 63 060129 | 3/1988 |
| JP | 63222234 | 9/1988 |
| JP | 5-32431 | 2/1993 |
| JP | 05249422 | 9/1993 |
| JP | 6242260 A | 9/1994 |
| JP | 52031757 | 3/1997 |
| JP | A H09-507206 | 7/1997 |
| JP | 09-312245 | 12/1997 |
| JP | 2000-163031 | 6/2000 |
| JP | 200203895 A | 7/2000 |
| JP | 2002-342033 | 11/2002 |
| JP | 2005-162549 | 6/2005 |
| JP | 2007-099557 | 4/2007 |
| JP | 2008-001590 | 1/2008 |
| JP | 2008007360 | 1/2008 |
| JP | 2008-066126 A | 3/2008 |
| JP | A 2008-216938 | 9/2008 |
| JP | A 2008-306149 | 12/2008 |
| JP | WO 2009/078406 | 6/2009 |
| JP | 2010 064943 | 3/2010 |
| JP | A 2010-116276 | 5/2010 |
| JP | 2010/195600 | 9/2010 |
| JP | 2011-032124 | 2/2011 |
| JP | 2011-527661 | 11/2011 |
| KR | 2010-2006-005920 | 1/2006 |
| TW | 201007521 A | 2/2010 |
| TW | 201235744 A1 | 9/2012 |
| WO | WO 00/47529 A | 8/2000 |
| WO | WO 02/42838 A1 | 5/2002 |
| WO | WO 2004/106253 A | 12/2004 |
| WO | WO 2008/044694 A | 4/2008 |
| WO | WO 2008/143999 A1 | 11/2008 |
| WO | WO 2009/003029 | 12/2008 |
| WO | WO 2009/099615 | 8/2009 |
| WO | WO 2009/102326 | 8/2009 |
| WO | WO 2009125133 A2 | 10/2009 |
| WO | WO 2010/005578 | 1/2010 |
| WO | WO 2010/014163 | 2/2010 |
| WO | WO 2010/019829 A1 | 2/2010 |
| WO | WO 2010/080988 | 7/2010 |
| WO | WO 2010/101961 | 9/2010 |
| WO | WO 2011/041484 A1 | 4/2011 |
| WO | WO 2012/015960 | 2/2012 |
| WO | WO 2012/106280 | 8/2012 |
| WO | WO 2013/106242 A2 | 7/2013 |

OTHER PUBLICATIONS

Wikipedia: "Iphone 4", www.wikipedia.org, retrieved Oct. 31, 2011, 15 pgs.

(56) References Cited

OTHER PUBLICATIONS

"Toward Making Smart Phone Touch-Screens More Glare and Smudge Resistant", e! Science News, http://eciencenews.com/articles/2009/08/19toward.making.smart.phone.touch.screens.more.glare.and.smudge.resistant, Aug. 19, 2009, 1 pg.

Arun K. Varshneya, Chemical Strengthening of Glass: Lessons Learned and Yet to be Learned International Journal of Applied Glass Science, 2010, 1, 2, pp. 131-142.

Aben "Laboratory of Photoelasticity", Institute of Cybernetics at TTU, www.ioc.ee/res/photo.html, Oct. 5, 2000.

Forooghian et al., Investigative Ophthalmology & Visual Science; Oct. 2008, vol. 49, No. 10.

"iPhone 4", Wikipedia, Jan. 4, 2012, 17 pgs.

Mehrl et al., "Designer's Noticebook: Proximity Detection IR LED and Optical Crosstalk", http://ams.com/eng/content/view/download/145137, Aug. 1, 2011, 5 pages.

Lee et al., "A Multi-Touch Three Dimensional Touch-Sensitive Tablet", Proceedings of CHI: ACM Conference on Human Factors in Computing Systems, Apr. 1985, pp. 21-25.

Rubine, "The Automatic Recognition of Gestures", CMU-CS-91-202, Submitted in Partial Fulfillment of the Requirements of the Degree of Doctor of Philosophy in Computer Science at Carnegie Mellon University, Dec. 1991, 285 pages.

Rubine, "Combining Gestures and Direct Manipulation", CHI'92, May 1992, pp. 659-660.

Westerman, "Hand Tracking, Finger Identification and Chrodic Manipulation of a Multi-Touch Surface", A Dissertation Submitted to the Faculty of the University of Delaware in Partial Fulfillment of the Requirements for the degree of Doctor of Philosophy in Electrical Engineering, Spring 1999, 364 pages.

Karlsson et al., "The Technology of Chemical Glass Strengthening-a review", Apr. 2010, Glass Technology, European Journal of Glass Science and Technology A., vol. 51, No. 2, pp. 41-54.

Office Action for Taiwanese Patent application No. 102102718, mailed Aug. 1, 2014.

Ohkuma, "Development of a Manufacturing Process of a Thin, Lightweight LCD Cell", Department of Cell Process Development, IBM, Japan, Section 13.4, 2000.

\* cited by examiner

FUSED GLASS DEVICE HOUSINGS

CROSS-REFERENCE TO RELATED APPLICATION

This application is a continuation of U.S. patent application Ser. No. 13/358,389, filed Jan. 25, 2012 and entitled "FUSED GLASS DEVICE HOUSINGS," which is hereby incorporated herein by reference.

BACKGROUND

This relates to electronic devices and, more particularly, to glass structures for electronic devices.

Electronic devices such as cellular telephones, handheld computers, and portable music players often include housings with glass members. For example, a device with a display may have a glass cover that serves as a protective layer. In some devices, a rear housing surface may be formed from a layer of glass.

To ensure satisfactory robustness, it is generally desirable to form device housing structures such as cover glass layers and housing surfaces from structures that are sufficiently strong to prevent damage during accidental impact events. For example, it is generally desirable to form portable devices that are subject to drop events from structures that are able to withstand the forces involved in a typical drop event without incurring excessive damage.

Glass strength and device aesthetics can sometimes be enhanced by using sufficiently thick glass layers. However, the size and weight of a device should not be excessive. If care is not taken, modifications that are made to ensure that a device has glass structures that are sufficiently strong, will make the device heavy and bulky.

It would therefore be desirable to be able to provide improved glass structures for electronic devices.

SUMMARY

An electronic device may have a glass housing structures. The glass housing structures may be used to cover a display and other internal electronic device components. The glass housing structures may cover a front face of an electronic device and, if desired, may cover additional device surfaces.

The glass housing structure may have multiple glass pieces that are joined using a glass fusing process. A peripheral glass member may be fused along the edge of a planar glass member to enhance the thickness of the edge. A rounded edge feature may be formed by machining the thickened edge. Raised fused glass features may surround openings in the planar glass member. Raised support structure ribs may be formed by fusing glass structures to the planar glass member.

Multiple planar glass members may be fused together to form a five-sided box in which electronic components may be mounted. Display structures and other internal components may be slid into place between opposing glass sides of the box.

Opaque masking material and colored glass may be used to create portions of the glass housing structures that hide internal device components from view.

Further features of the invention, its nature and various advantages will be more apparent from the accompanying drawings and the following detailed description of the preferred embodiments.

DETAILED DESCRIPTION

Electronic devices such as computers, handheld devices, computer monitors, televisions, cellular telephones, media players, and other equipment may have displays and other components that are covered with glass structures. The glass structures, which may sometimes be referred to as glass housing structures, may be used to provide a protective transparent covering for a display or other optical component, may be used to form a housing sidewall, may be used to form other housing structures such as a rear housing wall or other housing structures, may be used to form raised features such as raised ribs that serve as support structures for a sheet of glass or other glass structures, or may otherwise be used in forming structures in an electronic device.

Figure 1:
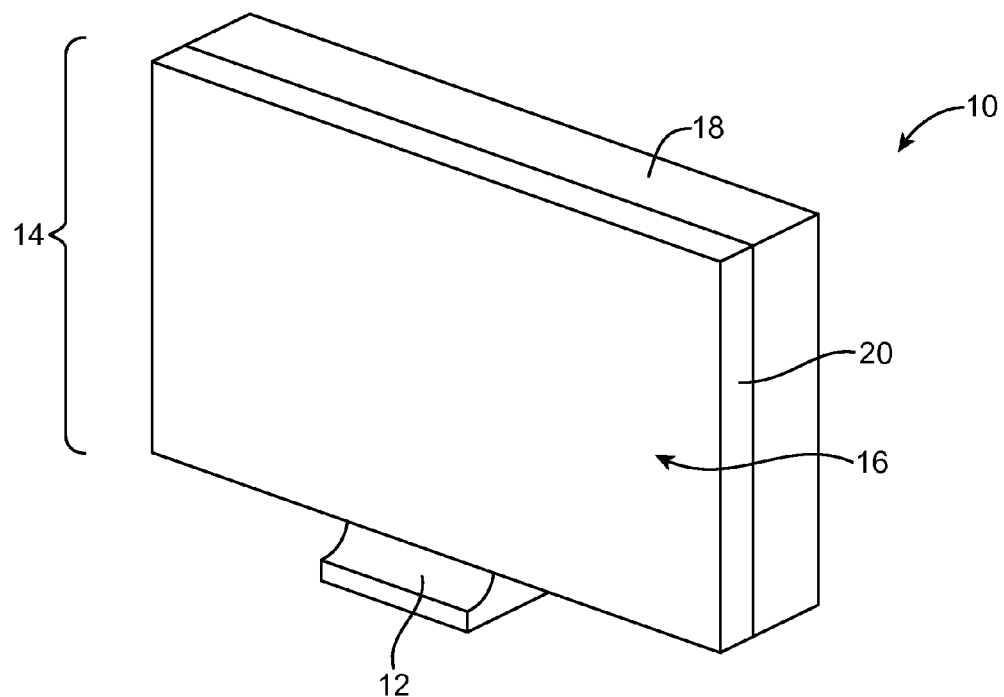
FIG. 1 is a perspective view of an illustrative electronic device with a display and a supporting stand in accordance with an embodiment of the present invention.

An example of an electronic device that may have glass housing structures is shown in FIG. 1. In the example of FIG. 1, electronic device 10 has a stand such as stand 12 on which main unit 14 has been mounted. Main unit 14 may include a display such as display 16 and a rear housing such as rear housing 18 (as an example). Device 10 may be a monitor, a monitor with an integrated computer, a television, or other electronic equipment.

Housing 18 may be formed from metal, plastic, glass, ceramic, carbon-fiber composite material or other fiber-based composite materials, other materials, or combinations of these materials. Display 16 may be covered with glass structures 20. Glass structures 20 may serve as a glass front housing structure for device 10. Glass structures 20 may be transparent so that display 16 may be viewed by a user of device 10 through glass structures 20. Display 16 may include display structures with image pixels formed from light-emitting diodes (LEDs), organic LEDs (OLEDs), plasma cells, electrowetting pixels, electrophoretic pixels, liquid crystal display (LCD) components, or other suitable image pixel structures. Touch sensor electrodes may be included in display 16 to provide display 16 with touch sensing capabilities (e.g., display 16 may be a touch screen) or display 16 may be touch insensitive.

Figure 2:
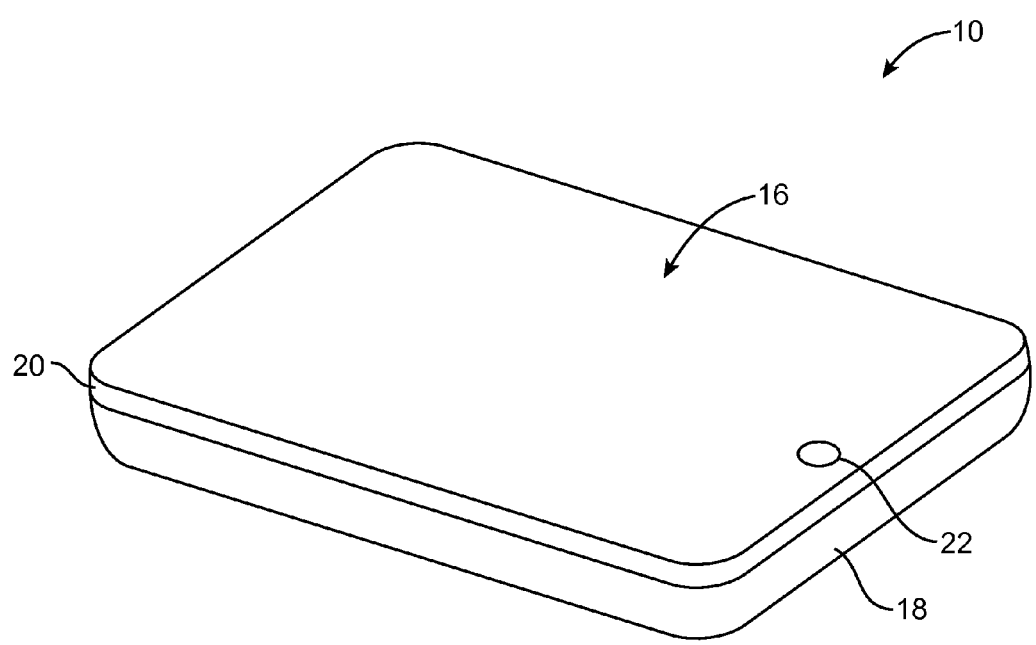
FIG. 2 is a perspective view of an illustrative electronic device such as a tablet computer in accordance with an embodiment of the present invention.

In the illustrative example of FIG. 2, device 10 is a portable device such as a tablet computer, gaming device, navigation device, etc. Display 16 may be mounted in housing 18. Display 16 may be covered with a display cover layer formed from glass structures 20. Openings may be formed in glass structures 20 to accommodate components such as button 22.

Figure 3:
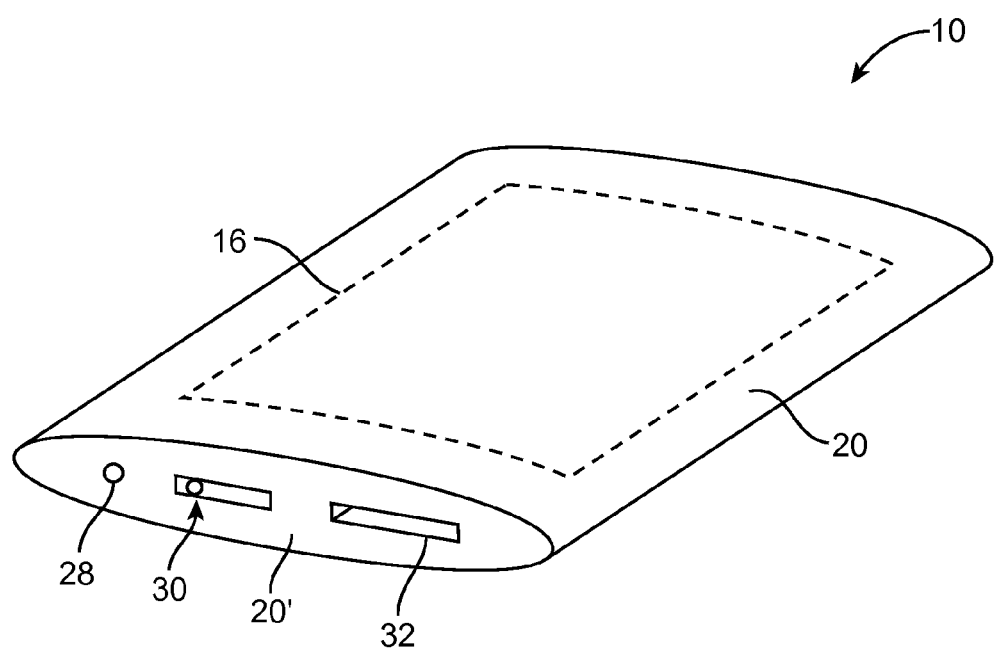
FIG. 3 is a perspective view of an illustrative electronic device such as a media player in accordance with an embodiment of the present invention.

FIG. 3 is a perspective view of electronic device 10 in a configuration in which the electronic device housing has been formed from glass structures 20 that surround internal device components. End face 20' of device 10 may also be formed from glass (as an example) and may include openings for audio jack 28, switch 30, and digital connector port 32 (as examples). Display 16 may be used to display images on one or more sides of device 10. The portion of glass structures 20 of FIG. 3 that overlap display 16 may be transparent, so that the images displayed by display 16 may be visible by a user of device 10 through glass structures 20. The rear surface of glass structures 20 may be transparent or may be colored (as examples).

Figure 4:
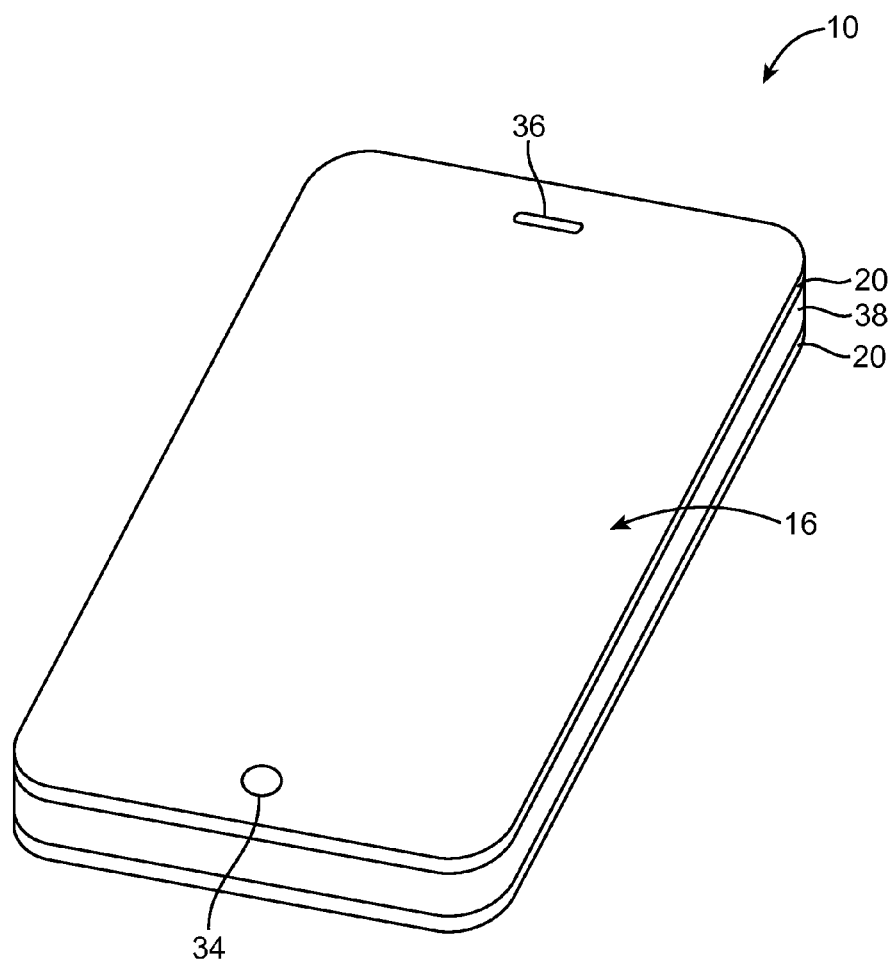
FIG. 4 is a perspective view of an illustrative portable electronic device such as a cellular telephone or other handheld device in accordance with an embodiment of the present invention.

In the illustrative example of FIG. 4, device 10 has been provided with upper and lower glass layers 20. Housing structure 38 (e.g., a layer of glass, ceramic, plastic, fiber-based composite, other material, or combination of these materials) may optionally be interposed between upper and lower glass structures 20. Structures 20 and optional structure 38 may form a housing for device 10. Display 16 may be mounted behind upper glass layer 20 (e.g., on the front face of device 10). Openings in glass structures 20 may be used to accommodate buttons such as button 34 and other components (e.g., a speaker aligned with speaker port 36).

The illustrative device configurations of FIGS. 1, 2, 3, and 4 are merely illustrative. Any suitable electronic equipment may be provided with glass housing structures, if desired.

Figure 5:
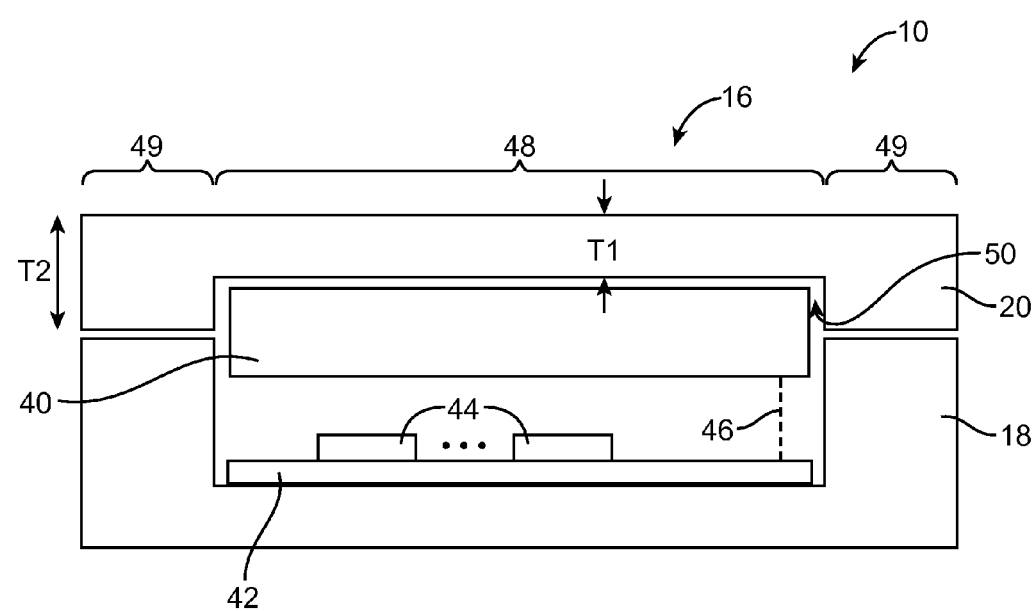
FIG. 5 is a cross-sectional side view of an illustrative electronic device having a display formed from display structures that are received within a recess in covering glass structures in accordance with an embodiment of the present invention.

FIG. 5 is a cross-sectional side view of electronic device 10 in a configuration in which glass housing structure 20 has been used to form a cover glass layer over display structures 40. Display structures 40 may be used to form display 16.

Display structures 40 may include a number of layers of material. These layers may include, for example, layers of glass, layers of plastic, and layers of adhesive. A liquid crystal display may have layers of polarizer, light diffusing elements, light guides for backlight structures, and a liquid crystal layer. An organic light-emitting diode (OLED) display may have organic materials that are used in producing light. An array of circuit components such as a thin-film transistor (TFT) array may be used to drive the image pixels in a display. This array of circuitry may be formed on a substrate material such as glass or polymer. The substrate layer on which the thin-film transistors and/or other circuitry for the display are formed may sometimes referred to as a TFT substrate or transistor substrate.

Glass housing structures 20 may be mounted to housing structures 18 (e.g., housing structures formed from metal, glass, plastic, fiber-based composites, etc.). Internal components may be mounted within the housing of electronic device 10. For example, device 10 may include a printed circuit such as printed circuit 42. Printed circuit 42 may be a rigid printed circuit board (e.g., a fiberglass-filled epoxy board), a flexible printed circuit ("flex circuit") formed from a flexible sheet of polyimide or other polymer layer, or may formed using other dielectric substrate materials. Components 44 such as switches, connectors, discrete circuit elements such as capacitors, resistors, and inductors, integrated circuits, and other electronic devices may be mounted to substrate 42. Display structures 40 may be coupled to circuitry on substrates such as substrate 42 using communications path 46 (e.g., a flex circuit cable or other suitable path).

To help maximize the interior volume in device 10 and reduce the size and weight of glass structures 20, center portion 48 of glass structures 20 may have a thickness T1 that is smaller than edge thickness T2. The smaller size of thickness T1 may create a recessed portion 50. Recess 50 in center portion 48 may have a rectangular shape or other suitable shape and may be configured to receive internal components in device 10 such as display structures 40. The larger size of edge thickness T2 relative to center thickness T1 may help strengthen glass structure 20 along its periphery to prevent damage in the event of an impact event. The larger size of the edges of glass structures 20 may also improve device aesthetics.

Glass structures 20 may have a rectangular periphery (e.g., glass structures 20 may be formed from structures such as a planar sheet having a rectangular outline when viewed from above) and center portion 48 may form a rectangular recess within center of glass structures 20. In this type of configuration, thickened edge portions 49 may form a rectangular ring that runs around the periphery of glass structure 20. If desired, glass structure 20 may have other shapes (e.g., oval, circular, square, shapes with curved edges and/or straight edges, etc.). The thickened edge portions of glass structures 20 may also be provided along only part of the edges of glass structures 20, rather than the entire periphery of glass structures 20.

Housing structures such as structures 20 and 18 may be joined using interposed layers of adhesive, using fasteners, using interlocking engagement features such as snaps, or using other suitable attachment mechanisms.

Figure 6:
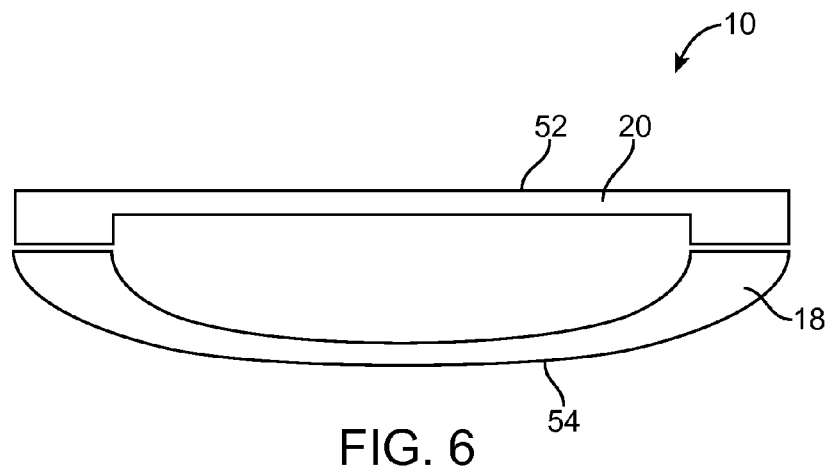
FIG. 6 is a cross-sectional side view of an illustrative electronic device having glass structures with thickened peripheral edges and a central recess that have been mounted to a curved rear housing in accordance with an embodiment of the present invention.

In the illustrative example of FIG. 6, glass structures 20 (e.g., the upper portion of the device housing) may have a planar exterior surface 52 and lower housing 18 (e.g., metal, glass, plastic, ceramic, fiber-based composites, etc.) may be have a curved exterior surface 54. A display or other structures may be mounted under the recessed portion of glass structures 20. Internal components 44 may be mounted in the interior of the device.

Figure 7:
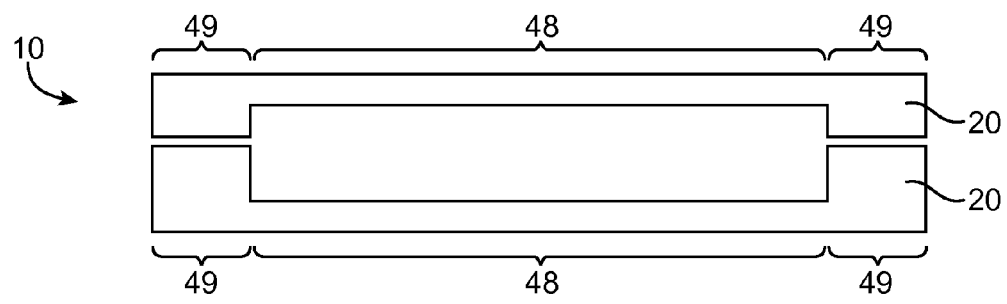
FIG. 7 is a cross-sectional side view of an illustrative electronic device having glass structures with thickened peripheral edges and a central recess that have been mounted to mating rear glass housing structures in accordance with an embodiment of the present invention.

FIG. 7 is an example in which device 10 has been provide with two substantially similar glass housing structures 20. Structures 20 may, as an example, have rectangular shapes with thinner (recessed) center regions 48 and thickened edges 49. One or more displays and other internal components may be provided in device 10 of FIG. 7.

Figure 8:
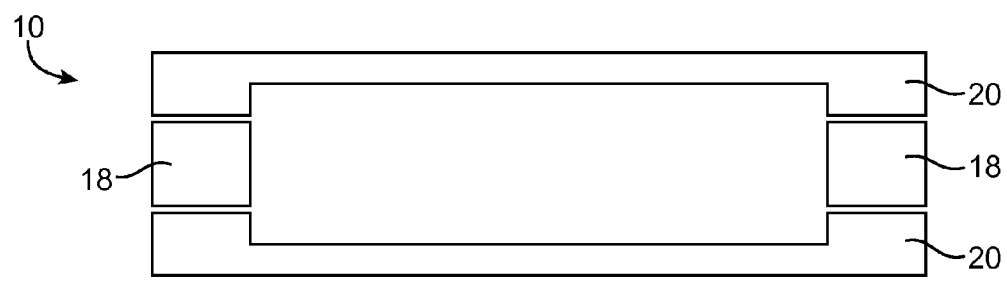
FIG. 8 is a cross-sectional side view of an illustrative electronic device having glass structures with thickened peripheral edges and a central recess that have been mounted mating rear glass housing structures using an interposed housing member in accordance with an embodiment of the present invention.

As shown in FIG. 8, device 10 may have a housing member such as housing sidewall structure 18 that is interposed between upper and lower glass housing structures 20. Structure 18 may be formed from metal, glass, ceramic, plastic, fiber-based composite material, other materials, or a combination of these materials. Upper and lower glass housing structures 20 in FIGS. 7 and 8 may have recessed portions (e.g., rectangular recesses), as described in connection with FIG. 5. Display structures and other internal device components may be received within the recesses of structures 20 of FIGS. 7 and 8.

Device structures such as glass structures 20 may be formed from multiple pieces of glass that are fused together. Glass structures may, for example, be heated to an elevated temperature (e.g., about 800° C.) that is above the glass fusion temperature and that is below the glass working temperature. Using a metal die or other glass fusing tool, the heated glass pieces may be pressed together. Glass structures that are fused together using this type of approach may have invisible or barely visible joint lines (i.e., the fused glass joints that are formed when fusing a first glass member to a second glass member may be invisible or barely visible to the naked eye).

Figure 9:
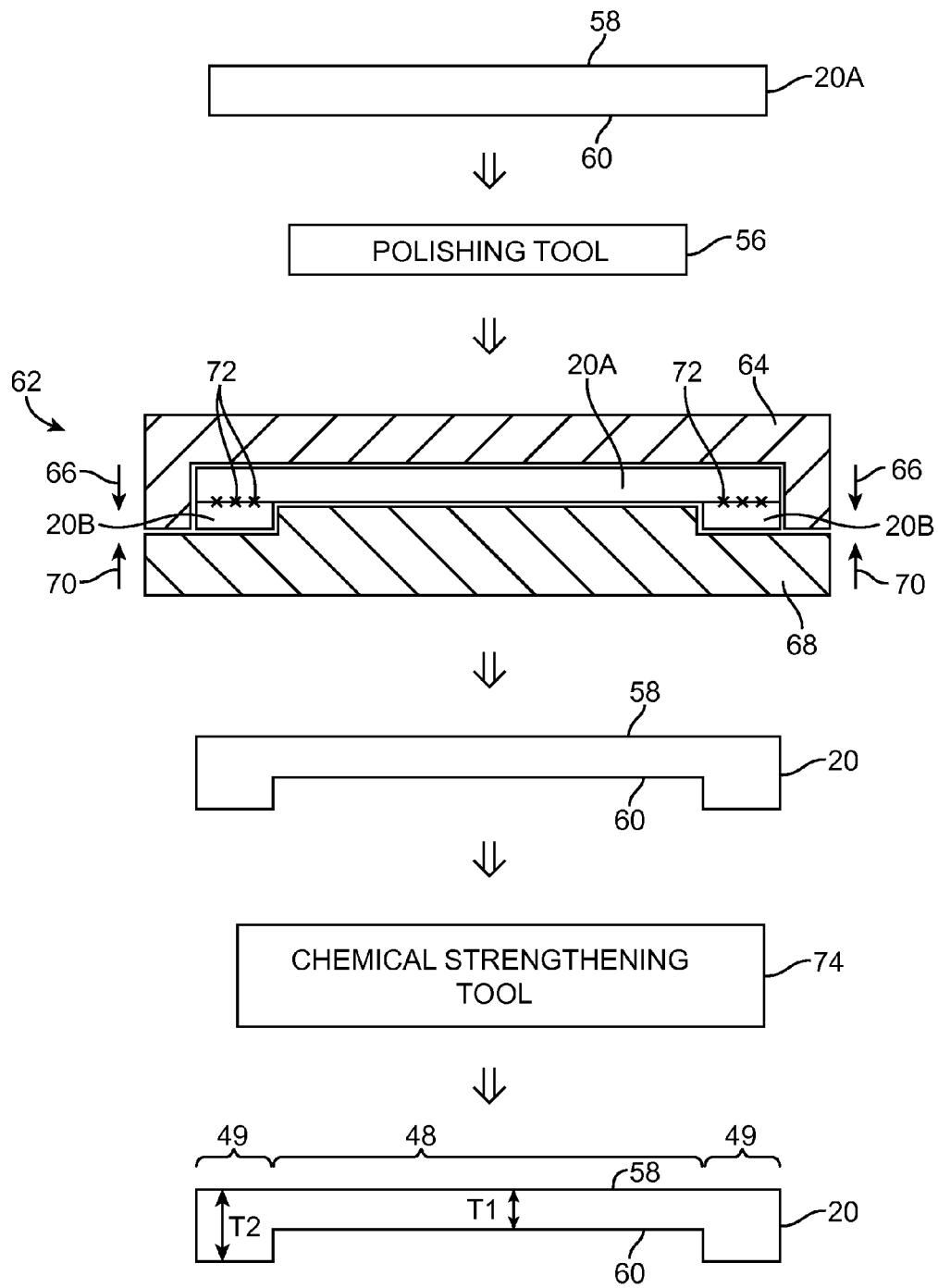
FIG. 9 shows equipment and operations involved in forming glass electronic device housing structures in accordance with an embodiment of the present invention.

Illustrative operations and equipment involved in forming glass structures 20 with recessed portion are shown in FIG. 9.

Initially, a portion of glass structures 20 such as planar glass member 20A may be formed and polished using polishing tool 56. For example, both upper surface 58 and lower surface 60 of glass structures 20A may be polished using tool 56. Polishing tool 56 may be used to perform mechanical and/or chemical polishing processes. Glass structures 20A may be formed from a glass sheet with a rectangular shape, a shape with curved edges, a shape with straight edges, or a shape with a combination of curved and straight edges.

Following polishing operations with tool 56, additional glass structures may be fused to glass structures 20A using heated press (fusing tool) 62. In particular, upper press member 64 may be moved downwards in direction 66 while lower press member 68 is moved upwards in direction 70 to press glass structures 20A and glass structures 20B together. During pressing, the temperature of glass structures 20A and 20B may be maintained at an elevated temperature of about 800° C. (e.g., a temperature above the fusion temperature of the glass and below the working temperature of the glass). This forms glass fusion bond 72 between structures 20A and 20B and fuses structures 20A and 20B together to form glass structures 20.

Glass structures 20B may, for example, be a peripheral glass member having the shape of a rectangular ring that runs around the periphery of a rectangular version of glass structure 20A or may be a glass member that runs around part of the periphery of glass structure 20A (as examples). The glass structures that are formed by fusing structures 20B to structures 20A may have an edge thickness T2 and a thinner central region of thickness T1, as described in connection with FIG. 5 (as an example). If desired, glass structures 20A and/or 20B may have other shapes (e.g., to form additional glass thickness around an opening in glass structure 20A, to form ribs or other supporting structures on glass structures 20A, to form a peripheral thickened edge portion around a non-rectangular piece of glass, etc.).

Because lower surface 60 of glass structures 20A was polished by tool 56, this surface may remain polished following fusion of glass structures 20B to glass structures 20A.

Following formation of glass structures 20 using glass fusing tool 62, glass structures 20 may be strengthened. For example, glass structures 20 may be strengthened using chemical strengthening tool 74. Chemical strengthening tool 74 may be used to immerse glass structures 20 in a bath containing potassium nitrate (as an example). Glass structures 20 may be free of glass frit at fusion joints 72, which may promote compatibility with chemical strengthening treatments. Heat-based tempering operations may also be performed to strengthen glass structures 20, if desired.

Following strengthening of glass structures 20 with chemical strengthening tool 74, glass structures 20 may have polished upper surface 58, polished lower surface 60, recessed central region 48 of thickness T1, and thickened edge regions 49 of thickness T2 (T2>T1). Glass structures 20 may then be assembled into device 10. For example, glass structures 20 may be attached to additional glass structures (using glass fusing, using adhesive, using fasteners, using mating engagement structures, etc.) and/or non-glass housing structures.

Figure 10:
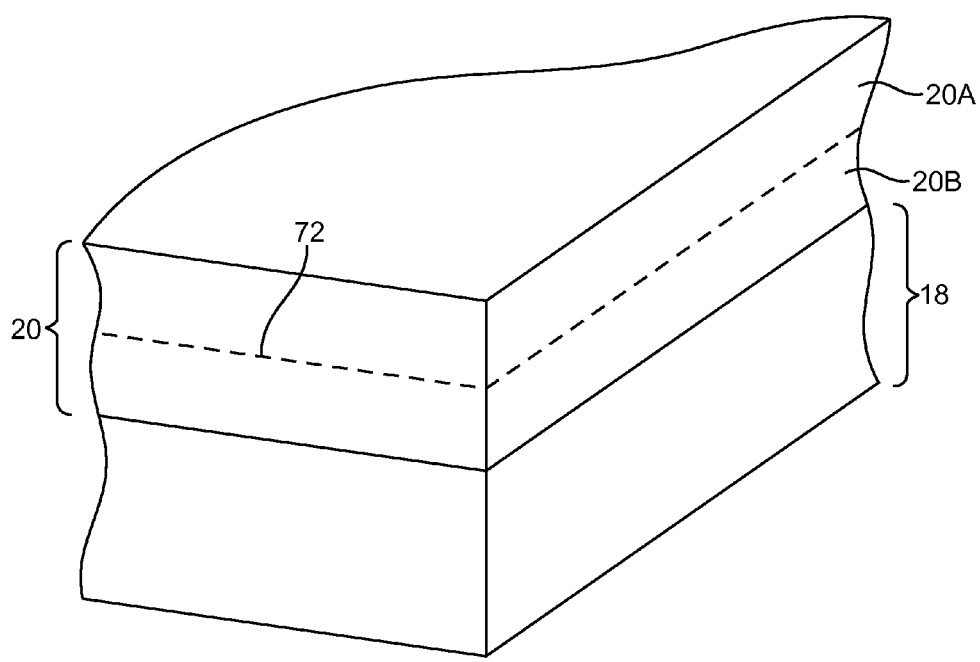
FIG. 10 is a perspective view of an illustrative corner portion of a glass device housing structure in accordance with an embodiment of the present invention.

As shown in FIG. 10, for example, glass structures 20 may be mounted to housing structures 18. Because of the use of the glass fusing process of FIG. 9 to join glass structures 20B to glass structures 20A, fusion joint 72 between structures 20A and 20B may be invisible or nearly invisible to the naked eye of the user of device 10, thereby enhancing device aesthetics. The enhanced thickness T2 of the edge portion of glass structures 20 (in the example of FIG. 10) may help improve the resistance of glass structures 20 to damage due to an impact event.

Figure 11:
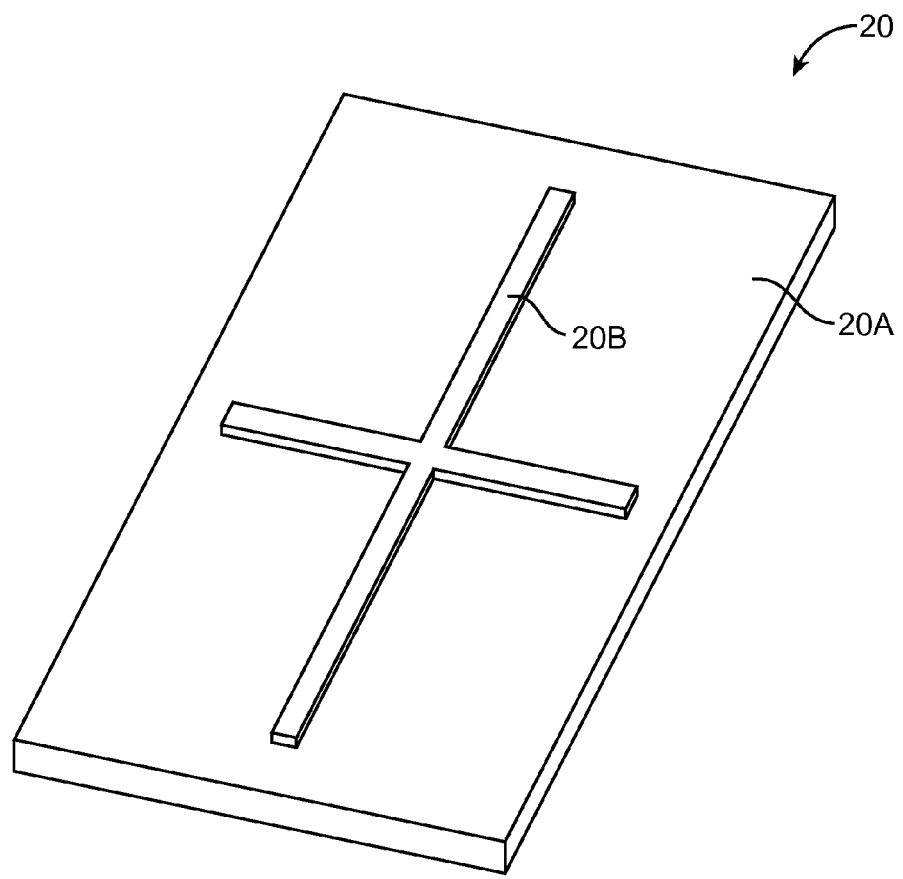
FIG. 11 is a perspective interior view of an illustrative planar glass housing member with support structures that have been implemented by fusing ribs of glass to the planar glass housing member in accordance with an embodiment of the present invention.

If desired, glass structures 20B may be fused to glass structures 20A in other patterns. For example, glass structures 20B that have the shape of strengthening support ribs may be fused across the center of the surface of glass structures 20A, as shown in FIG. 11. Strengthening features formed from structures 20B may have the shape of a cross (as shown in the example of FIG. 11), may have a T shape, may have a central arm with multiple branches, or may have any other suitable pattern. The strengthening structure pattern formed by glass structures 20B on structures 20A of FIG. 11 is merely illustrative.

Figure 12:
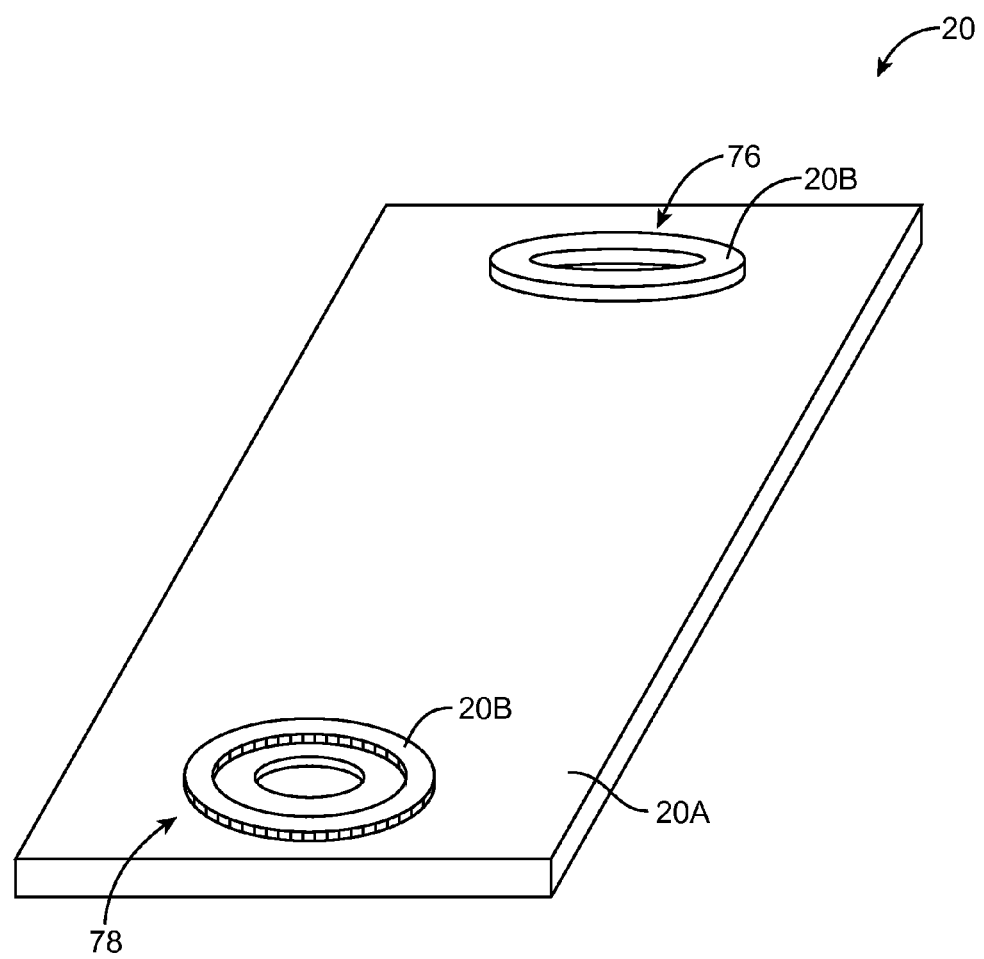
FIG. 12 is a perspective interior view of an illustrative planar glass housing member with raised fused glass structures that surround a speaker port opening and a button opening in the planar glass housing member in accordance with an embodiment of the present invention.

FIG. 12 is an interior perspective view of illustrative glass structures 20 that have been provided with openings such as button opening 78 (e.g., for button 34 of FIG. 4) and speaker port opening 76 (e.g., for speaker port 36 of FIG. 4). As shown in FIG. 12, glass structures 20B may be used to locally thicken glass structures 20A in the vicinity of one or more openings in glass structures 20A. Glass structures 20B may, for example, form raised rings or other raised structures that surround openings 36 and 34 to provided additional structural support for glass structures 20A in the vicinity of openings 36 and 34.

Figure 13:
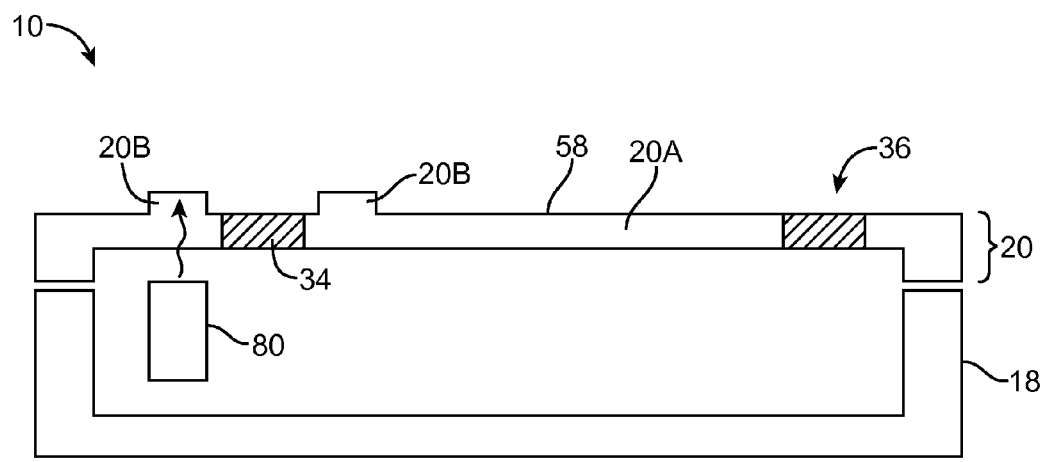
FIG. 13 is a cross-sectional side view of an illustrative device showing how glass housing structures in the device may be provided with raised fused glass portions on an exterior surface surrounding an opening for a button in accordance with an embodiment of the present invention.

FIG. 13 is an illustrative cross-sectional side view of device 10 in a configuration in which glass structures 20 have been provided with external features by fusing glass structures 20B to exterior surface 58 of glass structures 20A. In the example of FIG. 13, glass structures 20B have been used to create a raised feature such as a circular ring on the surface of glass structures 20A that surrounds button 34. Light source 80 may optionally be used to provide illumination for the raised ring formed by structures 20B. If desired, raised features may be formed elsewhere on surface 58 of glass structures 20A (e.g., surrounding speaker port 36, in a particular location on a touch screen, around the rectangular peripheral edge of display 16 and device 10, etc.).

Figure 14:
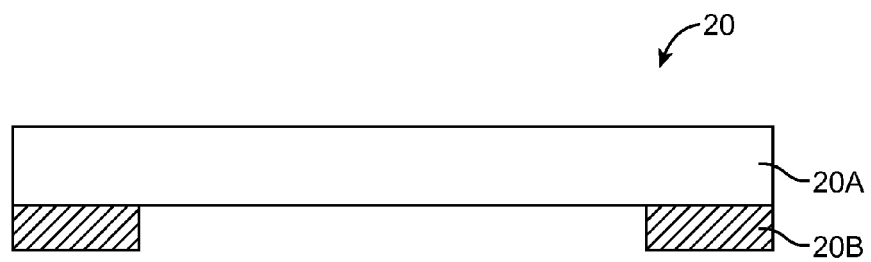
FIG. 14 is a cross-sectional side view of glass structures formed from by fusing a colored peripheral glass member to an edge portion of a planar glass member in accordance with an embodiment of the present invention.

Glass structures 20 may be formed from clear glass, glass with a colored tint (e.g., a blue tint, red tint, green tint, etc.), black glass, gray glass, or glass of other colors. As shown in FIG. 14, glass structures 20A and 20B may be formed from glass of different colors. For example, glass structures 20A may be formed from clear glass and glass structures 20B may be formed from black glass or non-clear glass of another color. The amount of color in structures 20B may be sufficient to render structures 20B dark or opaque in appearance or may allow structures 20B to remain transparent. The use of a color for structures 20B that is not clear may help hide interior device components from view through the edge of structures 20.

Figure 15:
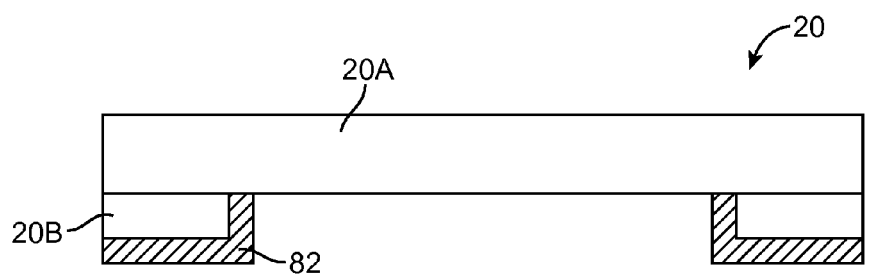
FIG. 15 is a cross-sectional side view of glass structures formed from by fusing a peripheral glass member to an edge portion of a planar glass member and covering the bottom and inner surfaces of the peripheral glass member with an opaque masking material in accordance with an embodiment of the present invention.

As shown in FIG. 15, internal device structures may also be hidden from view by providing structures 20B with a layer of opaque masking material 82. Material 82 may be black ink, white ink, colored ink, or other opaque substances (as an example).

Figure 16:
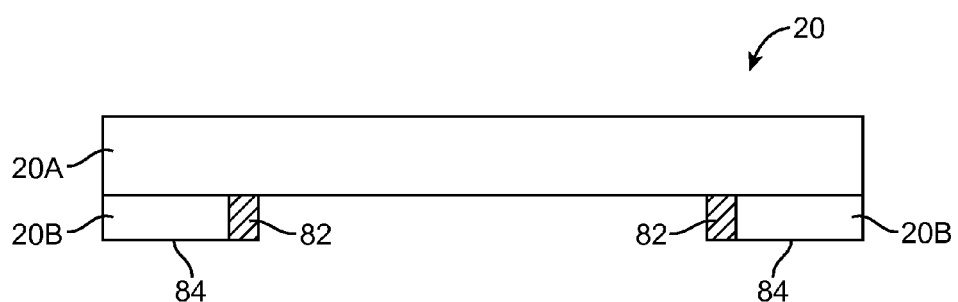
FIG. 16 is a cross-sectional side view of glass structures formed from by fusing a peripheral glass member to an edge portion of a planar glass member and covering the inner surface of the peripheral glass member with an opaque masking material in accordance with an embodiment of the present invention.

FIG. 16 shows how opaque masking material 82 may be formed on the inner edges of glass structures 20B. This may allow surfaces 84 of structures 20B to remain uncovered so that surfaces 84 may be attached to device structures using adhesive (as an example).

Figure 17:
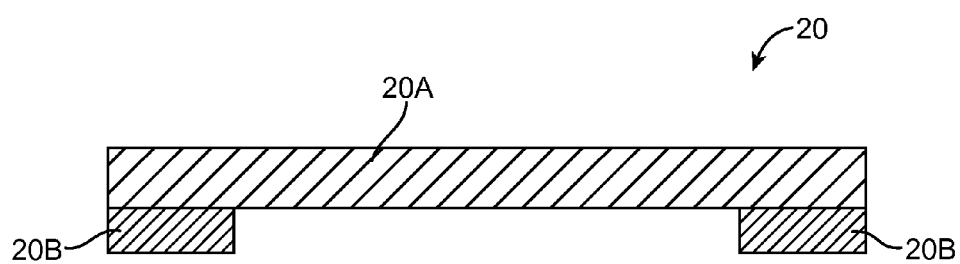
FIG. 17 is a cross-sectional side view of glass structures formed from by fusing a colored peripheral glass member to an edge portion of a colored planar glass member in accordance with an embodiment of the present invention.

FIG. 17 is a cross-sectional side view of glass structures 20 in a configuration in which glass structures 20A and glass structures 20B have both been formed from non-clear glass (e.g., black glass, gray glass, blue glass, green glass, other colored glass, etc.).

Figure 18:
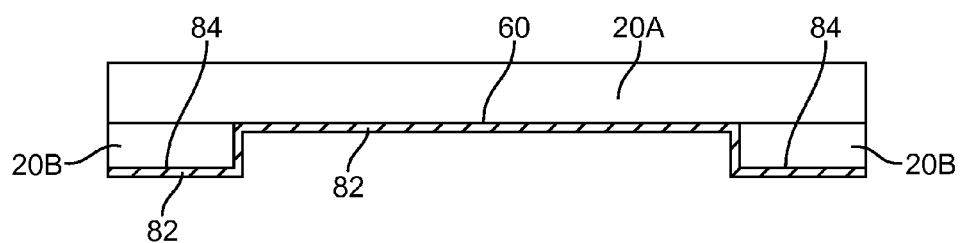
FIG. 18 is a cross-sectional side view of glass structures formed from by fusing a peripheral glass member to an edge portion of a planar glass member and coating the interior surface of the glass structures with an opaque masking material in accordance with an embodiment of the present invention.

In the FIG. 18 example, glass structures 20 have been provided with a layer of opaque masking material 82 (e.g., black ink, white ink, colored ink, or other opaque substance) that covers lower surface 60 of glass structures 20A and lower surfaces 84 of glass structures 20B.

Figure 19:
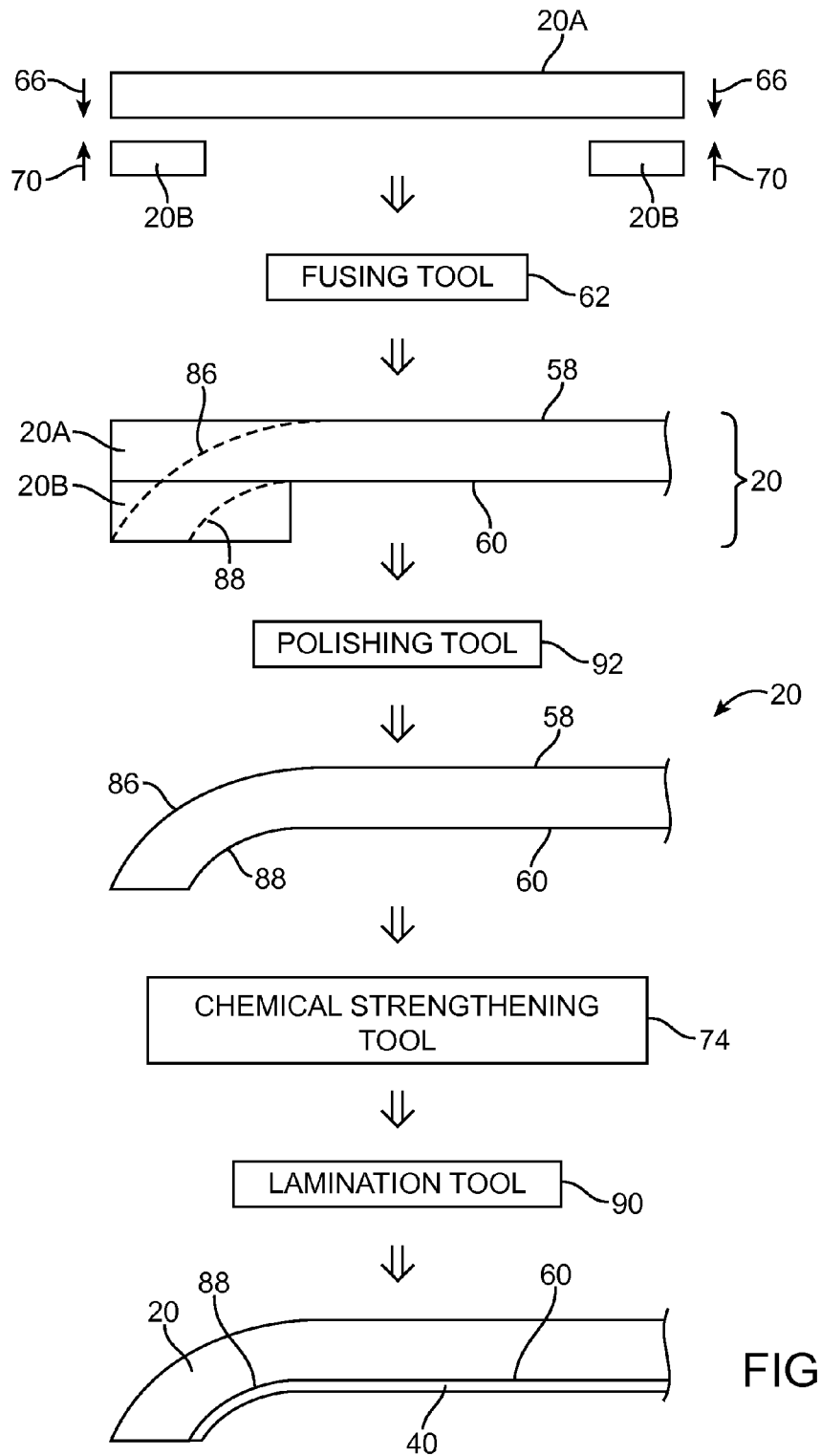
FIG. 19 is a diagram showing how glass electronic device housing structures may be provided with a rounded edge and a laminated flexible display structure in accordance with an embodiment of the present invention.

Illustrative operations involved in forming glass structures 20 with a recessed portion and curved features such as rounded edges are shown in FIG. 19.

As shown in FIG. 19, a portion of glass structures 20 such as polished planar glass member 20A may be fused with glass structures 20B by moving structures 20A in direction 66 while moving structures 20B in direction 70 while applying heat in fusing tool (heated press) 62.

After fusing structures 20A and 20B together using tool 62, tool 92 (e.g., a machining tool, grinding tool, polishing tool and/or other equipment for machining and polishing structures 20) may be used in removing excess glass along curved surfaces 86 and 88, thereby rounding the edges of glass structures 20.

Glass strengthening equipment such as chemical strengthening tool 74 may be used to strengthen glass structures 20 following formation of curved surfaces 86 and 88.

If desired, display structures 40 (FIG. 5) may be laminated to glass structures 20 using lamination tool 90. For example, display 16 may be laminated to lower planar polished surface 60 and curved interior surface 88 of glass structures 20 using adhesive. Display structures 40 may be formed using a substrate that is sufficiently flexible to allow display structures 40 to conform to the curved shape of surface 88. Display structures 40 may be for example, flexible structures for a flexible liquid crystal display, flexible electrowetting display structures, flexible electrophoretic display structures, or flexible organic light-emitting diode display structures (as examples).

Figure 20:
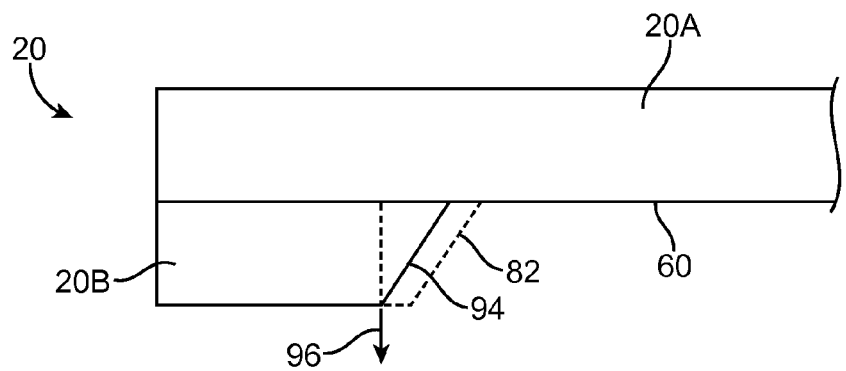
FIG. 20 is a cross-sectional side view of glass structures formed from by fusing a peripheral glass member with an angled edge to a planar glass member in accordance with an embodiment of the present invention.

As shown in FIG. 20, glass structures 20B may be provided with angled (beveled) inner edge surface 94. Surface 94 may be coated with an optional opaque masking material such as layer 82. The non-zero angle that is made by surface 94 with respect to surface normal 96 of planar lower surface 60 of planar glass member 20A may help improve the strength of glass structures 20.

Figure 21:
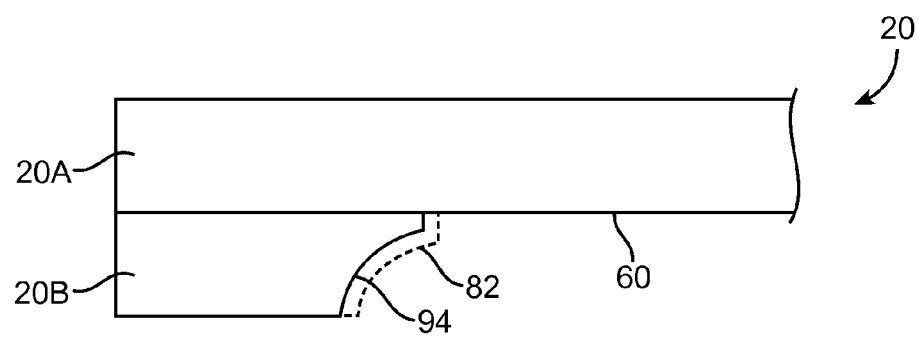
FIG. 21 is a cross-sectional side view of glass structures formed from by fusing a peripheral glass member with a curved edge to a planar glass member in accordance with an embodiment of the present invention.

In the FIG. 20 configuration, the inner edge of glass structures 20B has been provided with a planar surface (i.e., surface 94 is flat). An illustrative arrangement in which the inner edge of glass structures 20B has been provided with a curved surface (curved surface 94) is shown in FIG. 21.

Figure 22:
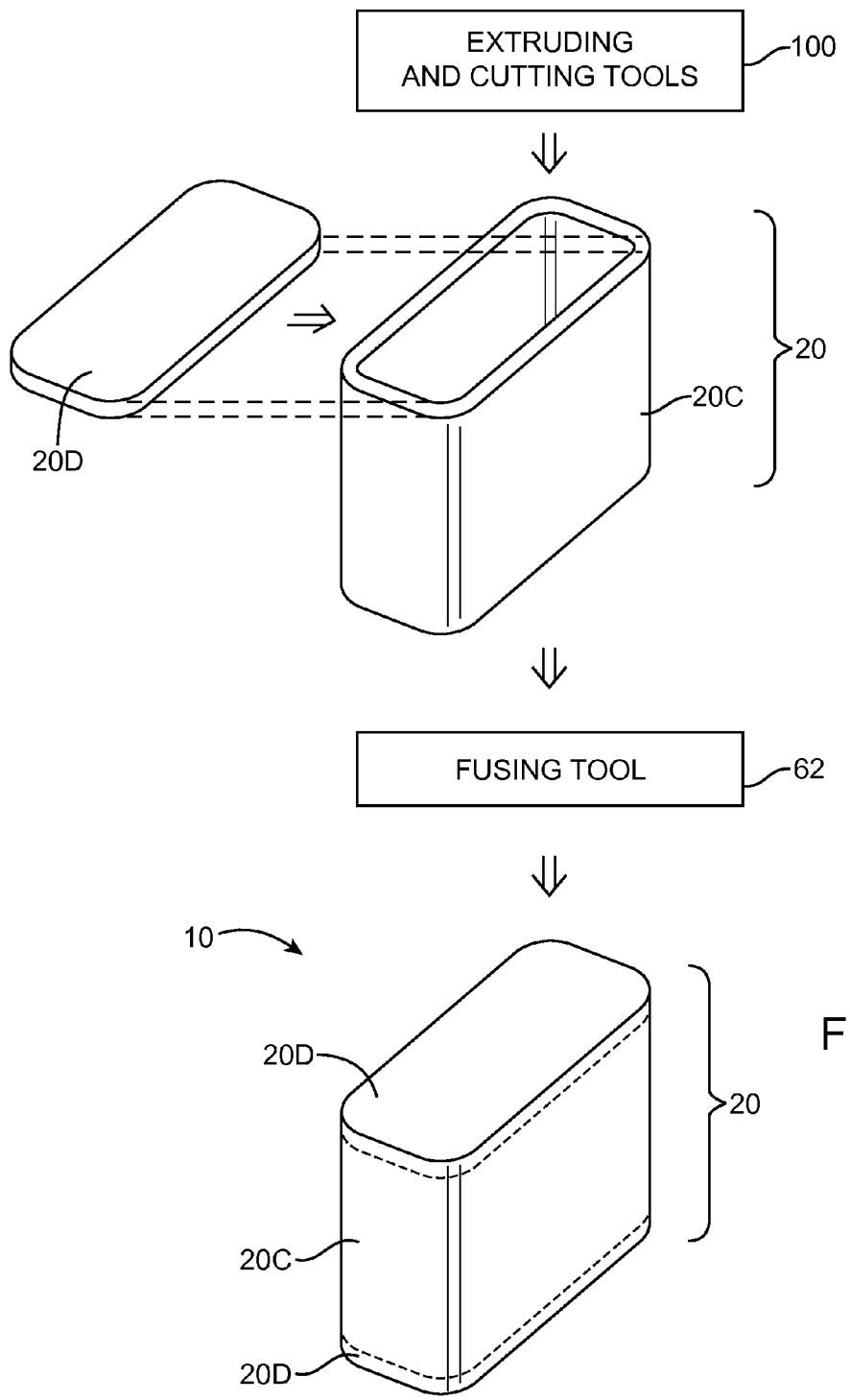
FIG. 22 is a diagram showing how an extruded glass structures for an electronic device housing may be provided with a fused end cap in accordance with an embodiment of the present invention.

FIG. 22 shows how glass structures 20 may be formed from extruded glass structures such as extruded hollow-rod-shaped glass structure 20C and associated cap structures such as end cap glass structure 20D. Glass structures 20C and 20D may be formed using glass extruding and machining tools such as tools 100. Fusing tool 62 may be used to fuse structures 20C and 20D together. If desired, electronic component may be housed within the interior of extruded glass structures 20D. Fused caps 20C may be used to enclose these internal components within the interior of device 10.

Figure 23:
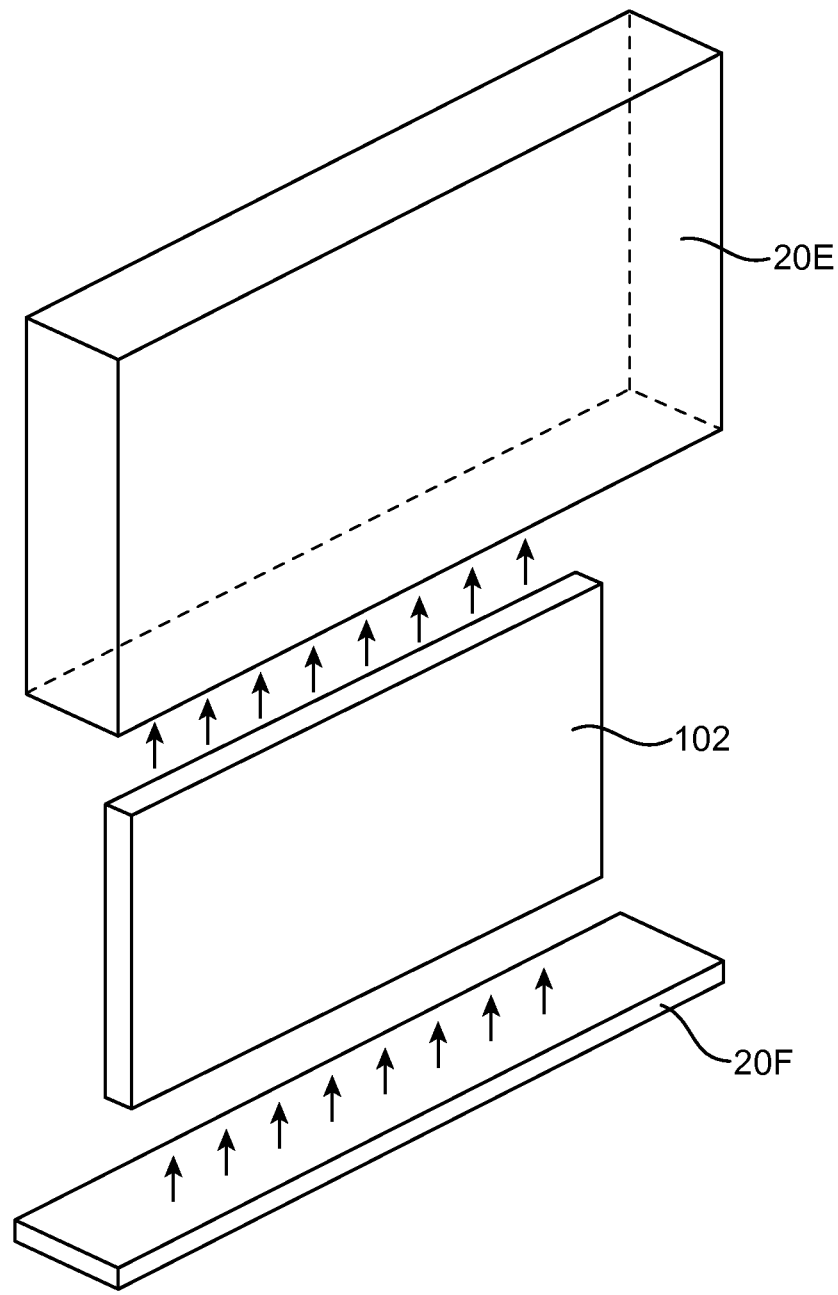
FIG. 23 is a diagram showing how glass housing structures formed from a five-sided box of fused glass members may be provided with internal components in accordance with an embodiment of the present invention.

FIG. 23 shows how internal electronic device components 102 may be inserted into glass structures 20E and, if desired, may be covered with fused end cap 20F. Structures 20E may be formed by fusing together five glass members to form a five-sided box with a lower face that is open to receive components 102. The five-sided box may be formed from a first pair of opposing planar structures (e.g., front and rear sheets of glass), a second pair of opposing planar structures (e.g., opposing left and right sheets or strips of glass), and a fifth planar sheet (or strip) of glass such as end cap layer 20F that have been fused together using fused joints. An air gap may be formed between opposing glass walls in box-shaped glass structures 20E. Ribs or other strengthening structures such as structures 20B of FIG. 11 may be formed on one, two, three, four, or more than four of the surfaces of the five-sided box-shaped glass structures 20E of FIG. 23.

Components 102 may be inserted into the interior of structures 20E (e.g., in the gap formed between the opposing front and rear sheets and between the opposing right and left sheets of glass). Components 102 may include, for example, display structures 40 for forming display 16 and other components (see, e.g., components 44 of FIG. 5). Glass structures 20E may be formed from sheets of glass that are fused together using fusing equipment such as fusing tool 62 (FIGS. 9 and 22). Glass structures 20F may be attached to glass structures 20E using glass fusing techniques, using adhesive, or using other attachment mechanisms.

Figure 24:
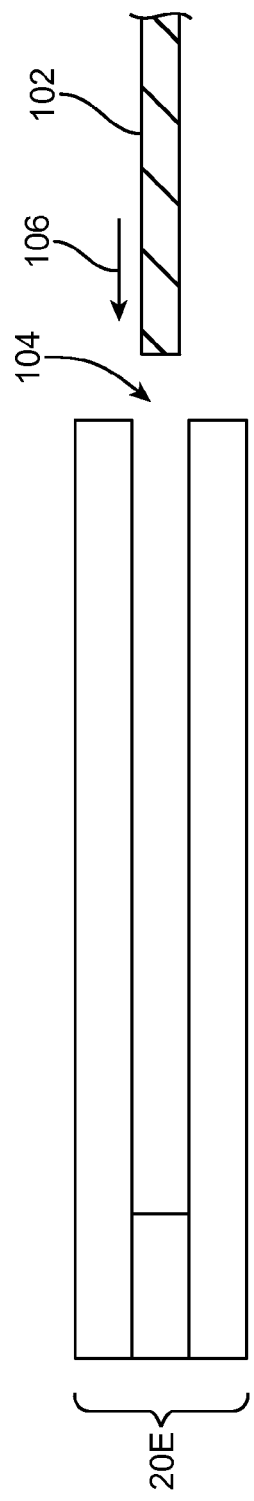
FIG. 24 is a diagram showing how internal components may be slid into a cavity within glass housing structures formed from a five-sided box of fused glass members in accordance with an embodiment of the present invention.
Figure 25:
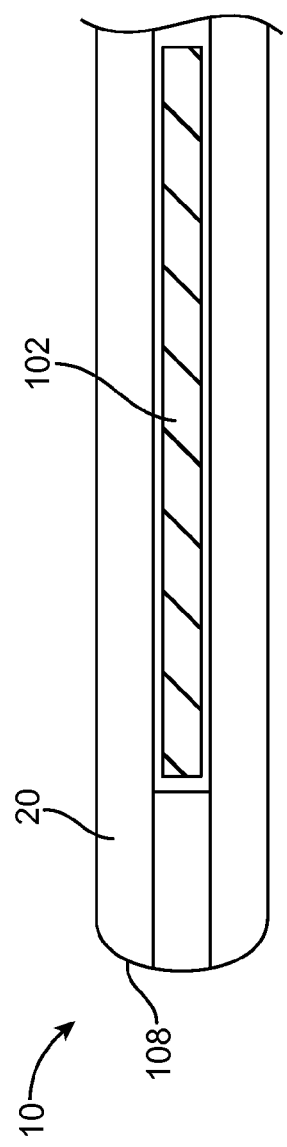
FIG. 25 is a cross-sectional side view of illustrative five-sided box glass fused glass structures that have been provided with internal components and a rounded edge in accordance with an embodiment of the present invention.

FIG. 24 is a side view of glass structures 20E showing how internal components 102 may be slid into the interior of glass structure 20E in direction 106 through end face opening 104 in glass structures 20E. If desired, machining techniques such as the curved edge machining techniques described in connection with FIG. 19 may be used in creating curved surfaces on glass structures 20E (see, e.g., rounded edge surfaces 108 of glass structures 20 of device 10 in FIG. 25).

Figure 26:
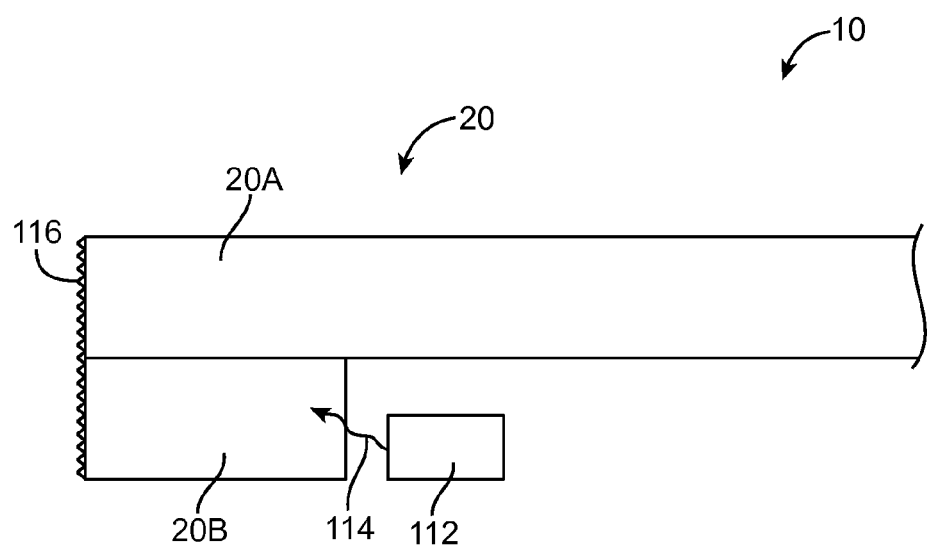
FIG. 26 is a cross-sectional side view of glass structures formed by fusing a peripheral glass member to a planar glass member and configured to be illuminated along an edge using a light source in accordance with an embodiment of the present invention.

As shown in FIG. 26, edge 116 of glass structures 20 may be provided with a roughened surface that helps to scatter and diffuse light. Device 10 may be provided with a light-emitting diode or other internal light source 112. Light source 112 may produce light 114 that strikes roughened edge surface 116 of glass structures 20. Light 114 may illuminate the exposed exterior edge of glass structures 20. Some or all of the peripheral edge portions of glass structures 20 may be illuminated in this way.

Figure 27:
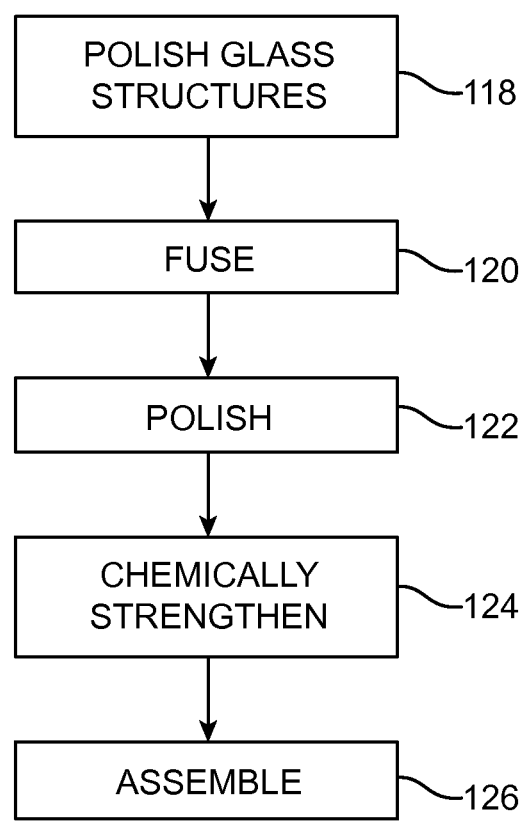
FIG. 27 is a flow chart of illustrative steps involved in forming glass housing structures in accordance with an embodiment of the present invention.

FIG. 27 is a flow chart of illustrative steps that may be used in forming glass structures 20.

At step 118, glass structures such as glass structures 20A and 20B may be polished using polishing equipment 56.

At step 120, fusing equipment 62 may be used to fuse two or more glass structures together. For example, glass structures 20A and 20B may be fused together to form glass structures 20 or the five sides of the five-sided-box glass structures of FIGS. 23 and 24 may be fused together.

If desired, additional machining and polishing operations may be formed at step 122. For example, a thickened edge portion (of thickness T2) of glass structures 20 may be machined and polished to form a rounded edge for glass structures 20, as shown in FIG. 19. If desired, machining operations to form a rounded edge structure on glass structures 20 may be performed during the operations of step 118 (e.g., using machining and polishing equipment).

At step 124, glass structures 20 may be strengthened using heat and/or chemical treatment. For example, glass structures 20 may be strengthened by applying a chemical bath to glass structures 20 using chemical strengthening tool 74.

At step 126, glass structures 20 may be assembled with other housing structures to form electronic device 10. Glass structures 20 may, for example, be attached to glass or non-glass housing structures 18 or other structures to form device 10. Internal components such as a display, integrated circuits, and other components may be mounted within the glass structures and other structures for the housing of device 10.

The foregoing is merely illustrative of the principles of this invention and various modifications can be made by those skilled in the art without departing from the scope and spirit of the invention.

What is claimed is:

1. An electronic device, comprising:
   a display; and
   a housing in which the display is mounted, wherein the housing includes glass structures that have a recess that receives at least part of the display, wherein the glass structures include a planar glass member and a peripheral glass member that extends around at least some peripheral edge portions of the planar glass member to form the recess,
   wherein the planar glass member has a thickness of T1 and the glass structures at the at least some peripheral edge portions have a thickness of T2, and wherein the thickness of T1 is less than the thickness of T2.

2. The electronic device defined in claim 1 wherein the peripheral glass member comprises non-clear glass.

3. The electronic device defined in claim 1 wherein the planar glass member is characterized by a surface normal and wherein the peripheral glass member has an inner edge that is angled at a non-zero angle with respect to the surface normal.

4. The electronic device defined in claim 1 wherein the peripheral glass member has an inner edge with a curved surface.

5. The electronic device defined in claim 1 wherein the peripheral glass member has an inner edge, the electronic device further comprising an opaque masking material that coats at least some of the inner edge.

6. The electronic device defined in claim 1 wherein the planar glass member and peripheral glass member have curved portions that form a rounded edge for the housing.

7. The electronic device defined in claim 1 wherein the housing comprises a housing structure to which the glass structures are mounted, the electronic device further comprising internal electrical components mounted between the housing structure and the glass structures.

8. The electronic device defined in claim 7 wherein the housing structure comprises a metal structure.

9. The electronic device defined in claim 7 wherein housing structure comprises glass.

10. The electronic device defined in claim 1 wherein the planar glass member is fused with the peripheral glass member.

11. The electronic device defined in claim 10 wherein the housing comprises a housing structure to which the glass structures are mounted, the electronic device further comprising internal electrical components mounted between the housing structure and the glass structures.

12. The electronic device defined in claim 11 wherein the peripheral glass member has an inner edge, the electronic device further comprising an opaque masking material that coats at least some of the inner edge.

13. The electronic device defined in claim 12 wherein the planar glass member and peripheral glass member have curved portions that form a rounded edge for the housing.

14. The electronic device defined in claim 11 wherein the peripheral glass member comprises non-clear glass.

15. The electronic device defined in claim 14 wherein the planar glass member and peripheral glass member have curved portions that form a rounded edge for the housing.

16. An electronic device, comprising:
    an electronic device housing formed from glass members including at least first and second opposing planar glass members that are separated by a gap formed between the first and second opposing planar glass members; and
    display structures inserted into the gap.

17. The electronic device defined in claim 16 wherein the electronic device housing includes a clear portion through which the display is visible.

18. The electronic device defined in claim 17 further comprising opposing third and fourth planar glass members that are separated by another gap.

19. The electronic device defined in claim 16 further comprising fused glass rib support structures on the first planar glass member.

20. The electronic device defined in claim 16 wherein the electronic device housing includes a clear portion through which the display is visible.

* * * * *